United States Patent
Barrenscheen et al.

(10) Patent No.: US 6,653,963 B1
(45) Date of Patent: Nov. 25, 2003

(54) METHOD AND APPARATUS FOR THE A/D CONVERSION OF ANALOG SIGNALS AND CORRESPONDING A/D CONVERTER ARRANGEMENT

(75) Inventors: Jens Barrenscheen, Munich (DE); Dietmar Konig, Munich (DE); Gunther Fenzl, Hoehenkirchen-Siegertsbrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/048,346

(22) PCT Filed: Aug. 2, 2000

(86) PCT No.: PCT/DE00/02566
§ 371 (c)(1),
(2), (4) Date: Jun. 7, 2002

(87) PCT Pub. No.: WO01/10031
PCT Pub. Date: Feb. 8, 2001

(30) Foreign Application Priority Data

Aug. 2, 1999 (DE) .......................... 199 36 329

(51) Int. Cl.⁷ ............................................. H03M 1/12
(52) U.S. Cl. ...................... 341/155; 341/141; 340/347
(58) Field of Search ............................... 341/155, 120, 341/118, 119, 156, 131, 141, 142; 340/347

(56) References Cited

U.S. PATENT DOCUMENTS

| 4,016,557 A | | 4/1977 | Zitelli et al. ............... 340/347 |
| 4,521,763 A | * | 6/1985 | Murao et al. ............... 341/157 |
| 4,532,601 A | | 7/1985 | Lenderking et al. ........ 364/571 |
| 4,654,632 A | | 3/1987 | Yoshida et al. ............. 340/347 |
| 5,151,866 A | * | 9/1992 | Glaser et al. ................. 702/66 |
| 5,736,949 A | | 4/1998 | Ong et al. ................... 341/141 |
| 5,742,513 A | * | 4/1998 | Bouhenguel et al. ....... 700/286 |

FOREIGN PATENT DOCUMENTS

| DE | 33 03 798 C2 | 8/1984 |
| DE | 41 03 240 A1 | 8/1992 |
| DE | 195 34781 C1 | 1/1997 |
| DE | 198 47662 A1 | 4/2000 |
| EP | 0 616 123 A1 | 9/1994 |

* cited by examiner

Primary Examiner—Brian Young
Assistant Examiner—John Nguyen
(74) Attorney, Agent, or Firm—Fitzpatrick, Cella, Harper & Scinto

(57) ABSTRACT

An A/D converter arrangement comprises an A/D converter (6) to which analog signals from a plurality of signal channels (2) can be fed for A/D conversion. With the help of an appropriate control means (8), converter parameters of the A/D converter (6) or even other operating parameters of the A/D converter arrangement, such as certain functions performed in response to an A/D conversion which has been carried out for example, are set in a channel-specific way as a function of the signal channel (2) which is to be converted at the time.

31 Claims, 2 Drawing Sheets

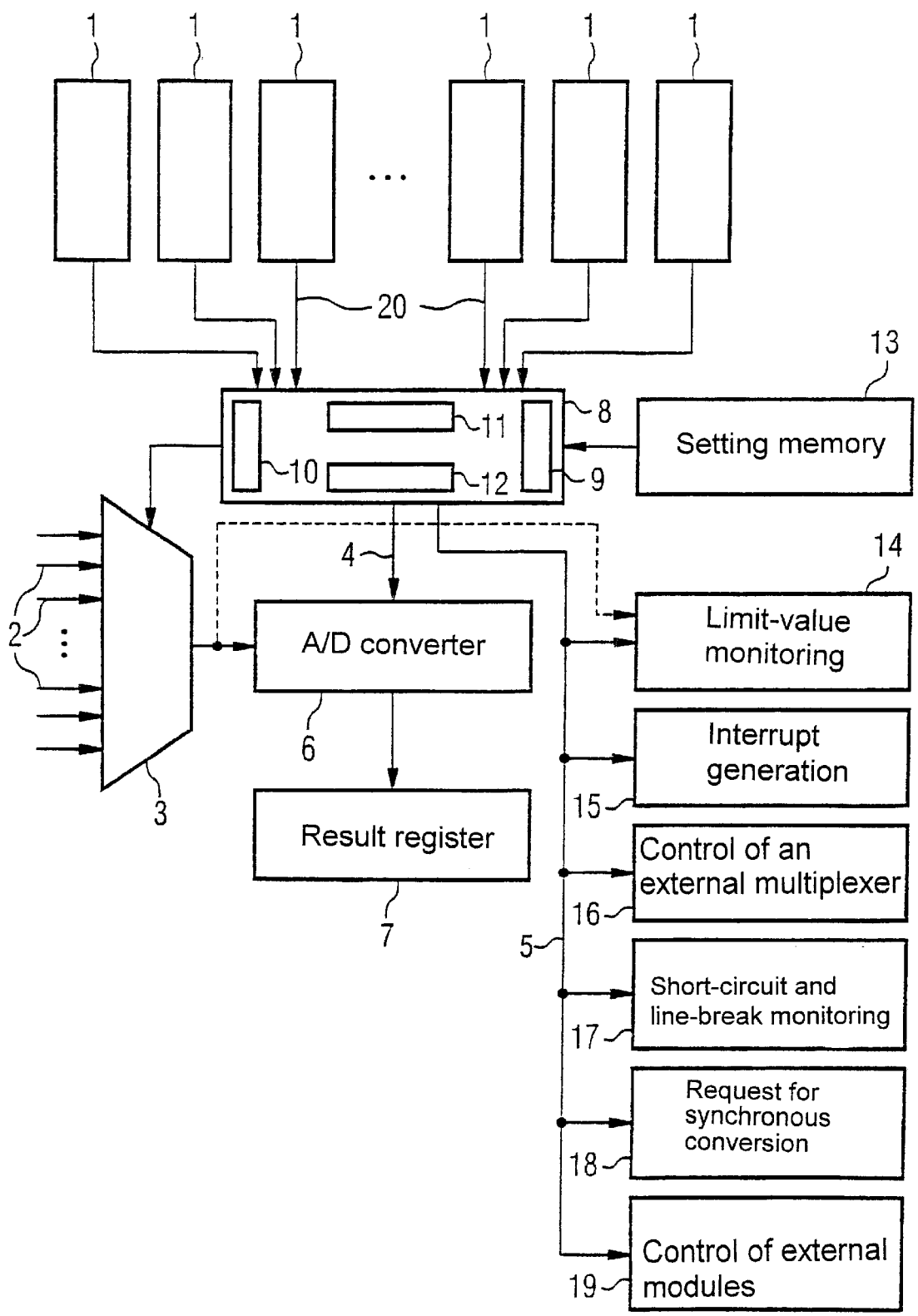

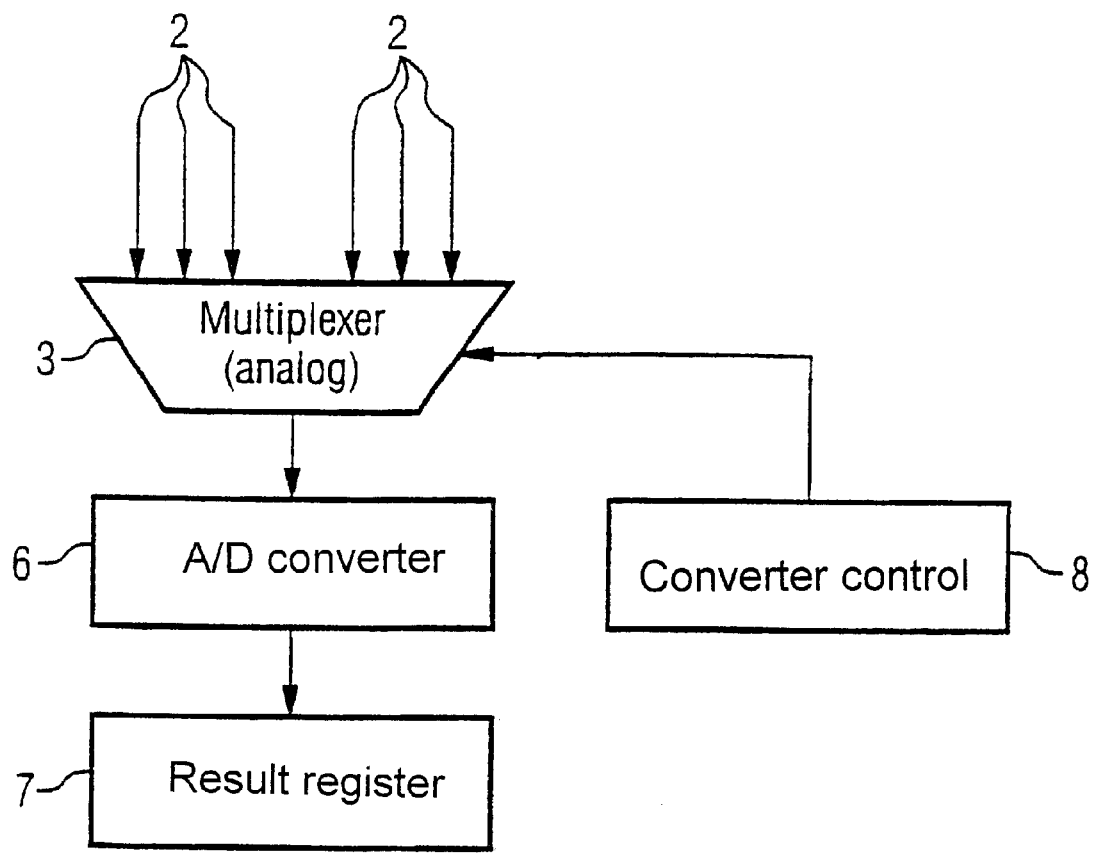

METHOD AND APPARATUS FOR THE A/D CONVERSION OF ANALOG SIGNALS AND CORRESPONDING A/D CONVERTER ARRANGEMENT

This application has been filed under 35 U.S.C. §371. Applicants hereby claim priority under the international Convention and all rights to which they are entitled under 35 U.S.C. §119 based upon International Application No. PCT/DE00/02566, filed Aug. 2, 2000, published in German (not English) as International Publication No. WO 01/10031 A2, and based upon German Application No. DE 199 36 329.3, filed Aug. 2, 1999.

BACKGROUND OF THE INVENTION

The present invention relates to a method for the A/D conversion of analog signals by means of an A/D converter and to a corresponding A/D converter arrangement.

In complex applications, different analog input signals have to be fed to an A/D converter and converted. An A/D conversion of the individual input signals may be requested in this case by different request sources, with the request sources generating request signals each time in order in this way to request the A/D conversion of a given signal channel at the A/D converter.

FIG. 2 is a simplified block circuit diagram of a known A/D converter arrangement, with an A/D converter 6 being controlled by an analog multiplexer 3. The multiplexer 3 is used to select a plurality of analog signals which are each assigned to different signal channels 2. Also provided is a control unit 8 which, as a function of the control information fed to it, controls the multiplexer 3 in such a way that a given signal channel 2 is selected and the corresponding analog signal is fed to A/D converter 6 for A/D conversion. After the conversion of a sampled value of this analog signal, the result of the A/D conversion is stored in a result register 7. Hence it is also possible in this way for the control unit 8 to specify the mode of operation of the A/D converter arrangement to enable not only a single-channel conversion to be performed but also an autoscan conversion where all the signal channels 2 are converted once and one after the other, etc.

In conventional A/D converter arrangements, basic settings are provided for the A/D converter 6 which may relate to, for example, the resolution, the sampling time or else the interrupt generation for the conversion requested. These basic settings are preset in fixed form by means of the internal architecture of the A/D converter 6 or the A/D converter arrangement. A change to these basic settings by software means for example is not possible and it is therefore equally impossible for the properties of the A/D converter 6 to be adapted to the particular application, as a result of which the scope of application of the entire A/D converter arrangement is limited.

BRIEF SUMMARY OF THE INVENTION

The object on which the present invention is based is therefore to propose a method for the A/D conversion of analog signals and a corresponding A/D converter arrangement whereby these limitations can be overcome and greater flexibility achieved.

This object is achieved in accordance with the present invention by a method having the features given in claim 1 and by an A/D converter arrangement having the features given in claim 19. The subclaims in each case describe preferred embodiments of the present invention.

It is proposed in accordance with the invention for certain settings or operating parameters of the A/D converter arrangement to be set as a function of the signal channel to be converted at the time. The operating parameters able to be set in a channel-specific way may in particular be parameters of the A/D converter, thus enabling the resolution, the sampling time, the conversion time, the calibration time or the range of measurement for example of the A/D converter to be individually set for each signal channel. This enables the processing of the individual signals channels to be adapted to the environment in the best possible way and the overall behaviour of the A/D converter arrangement to be optimised.

The setting of the A/D converter can be effected both by software means, i.e. by a suitable program, and by hardware means.

Each signal channel may have its own channel-specific settings assigned to it, which become active and are used for setting the A/D converter whenever an analog signal from the signal channel concerned is to be converted. To reduce the volume of data to be managed, the channels may also be combined into groups, in which case all the channels in a group are processed with the same settings. Where there are a plurality of request or triggering sources present which each generate request signals for A/D conversions, these sources too may have different settings assigned to them, as a result of which all the channels for whose signals an A/D conversion is requested by the same request source are processed with the same settings. Optimum flexibility can be achieved in particular when the principles described above of assigning the different settings are combined with one another. It may for example be extremely advantageous for a channel to be operated with its channel-specific settings unless a certain request source having its own settings requests the A/D conversion of this channel. The settings specific to the request source are thus given priority over the channel-specific settings when the settings are being selected.

As well as the parameters described above of the A/D converter it is also possible for other operating parameters of the A/D converter arrangement, which relate for example to certain digital functions of the A/D converter arrangement which form reactions to an A/D conversion, to be set, by which means it is possible to obtain a reduction in the load on the CPU. It is for example possible for certain parameters of interrupt generation, limit-value detection or short-circuit or line-break detection to be set or activated in a channel-specific way.

BRIEF DESCRIPTION OF THE DRAWINGS

The present invention will be explained in detail below by reference to the accompanying drawings and a preferred embodiment. In the drawings FIG. 1 is a block circuit diagram of an A/D converter arrangement according to the present invention, and FIG. 2 is a block circuit diagram of a known A/D converter arrangement.

DETAILED DESCRIPTION OF THE INVENTION

The A/D converter arrangement according to the present invention which is shown in FIG. 1 comprises as its central component an A/D converter 6 whose function is to sample and convert an analog signal fed to it. The A/D converter 6 may for example be constructed on the principle of "successive approximation and charge balancing". A converted sampled value of the particular analog signal is stored in a result register 7. The analog signals to be processed by A/D converter 6 are assigned to a plurality of signal channels 2, with one signal channel 2 to be processed at a time being selected via an external analog multiplexer and the analog signal from the selected signal channel being fed to the A/D converter 6.

The A/D converter arrangement comprises a plurality of sources 1 of A/D converter requests which can each request certain signal channels 2 to be converted by means of request signals 20. The request sources 1 may for example be a programmable timer which generates the request signals 20 for A/D converter 6 under the control of time. They may equally well be a hardware means which generates the request signals 20 under the control of a program. A request source 1 may also be produced in the form of a queue (FIFO), meaning that for certain signal channels 2 this request source 1 generates request signals for an A/D conversion in succession as dictated by their position in the queue. What is more, it is also possible for a request source 1 to be a synchronising unit which generates a request signal for an A/D conversion of a given signal channel 2 in synchronisation with a further A/D converter or an external timer. Finally, a request source 1 may generate a request signal 20 under event triggering. Other types of request source 1 are of course also possible.

The individual request signals 20 from request sources 1 are fed to a control unit 8 which actuates multiplexer 3 as a function of the signals, following a certain scheme, to select the signal channel 2 which is to be converted at the time.

Control unit 8 has assigned to it a setting memory 13 in which channel-specific settings for certain parameters of the A/D converter arrangement are stored for the individual signal channels 2. To reduce the amount of data, the signal channels 2 may also be combined into groups, in which case different settings, i.e. settings of its own for each request source, are stored for the individual groups. Request-source-specific settings for the relevant operating parameters of the A/D converter arrangement may also be stored in this setting memory 13.

Control unit 8 has setting prioritising logic 9 which, as a function of the signal channel 2 to be converted at the time, reads out the settings corresponding to this signal channel from setting memory 13. The prioritising logic may be so designed in this case that it gives the request-source-specific settings priority over the actual channel-specific settings, in such a way that a signal channel can only be operated with its own channel-specific settings as long as there is not a request signal 20 from a request source 1 present for which there are request-source-specific settings stored in memory 13. If on the other hand there is a request signal 20 from a request source 1 of this kind present, the request prioritising logic 9 ensures that the settings allocated to this request source 1 are read out and used to set the settable operating parameters of the A/D converter arrangement.

A setting unit 12 is responsible for actually adjusting the various operating parameters of the A/D converter arrangement as a function of the settings read out by the setting prioritising logic 9. The setting unit 12 may for example generate a setting signal 4 which directly causes various parameters of A/D converter 6 to be set accordingly. The parameters of A/D converter 6 which can be set in this channel-specific way may for example be the resolution (8, 10 or 12 bit) or the sampling time of A/D converter 6. This is useful because the accuracy of the voltage sampled by A/D converter 6 for the A/D conversion is determined by the charging time available for the sample-and-hold member which is used in the particular case and by the output impedance of the source of the analog signal. The conversion time (the time which the internal comparators have available to them also plays a part in the accuracy of A/D converter 6), the calibration time (with an increasing interval of time for calibration after an A/D conversion it is possible to obtain a more accurate result from the next conversion) or the range of measurement, i.e. the upper and lower limits of the range of measurement, can also be set in a channel-specific way. Similarly, the reference voltage of the A/D converter 6 for example can be selected in a channel-specific way. It is of course also possible to conceive of other converter parameters which can be set in a channel-specific way.

As well as the settings described above which relate directly to A/D converter 6, it is also possible to think of other settings, relating to other functions of the A/D converter arrangement, which may be activated in a channel-specific way or whose parameters may be set in a channel-specific way. This is done by means of a further setting or activating signal from setting unit 12. Certain of these possible (digital) functions, which can each be performed by the control unit 8 itself, will be briefly explained below.

The A/D converter arrangement shown in FIG. 1 comprises a programmable interrupt generating means 15. Different actions may be required depending on the signal channel which is being converted. The settable interrupt generation performed by means of setting signal 5 and means 15 increases the possible applications of the A/D converter arrangement and makes it possible for channel-specific actions to be initiated in a targeted manner with a minimum amount of programming work.

In addition, FIG. 1 shows there to be a function or unit 14 present for monitoring certain limit values of the analog signal to be converted at the time. In many applications it is necessary for analog values to be acquired but for means 15 to react by generating an interrupt only if a preset threshold or limit value is exceeded or dropped below. Via setting signal 5, the upper and/or lower limit value to be monitored at the time can be programmed in a channel-specific way, as a result of which it is possible to achieve a drastic reduction in the load on the CPU, particularly in conjunction with the smart interrupt generating means 15. Different limit values can be stored in memory 13 for each signal channel.

The connection of an external multiplexer to the A/D converter arrangement shown in FIG.1 can also be supported by the channel-specific generation and output of control signals. There is an appropriate means 16 provided for this purpose which, as a function of the setting signal 5 from control unit 8, generates corresponding control signals for the external multiplexer (not shown). In particular, it is conceivable in this case for different positions to be queried via the external multiplexer depending on the signal channel 2 to be converted or the request source 1 making a request.

An integral mechanism 17 for detecting a short-circuit and/or a line break which is shown in FIG.1 can likewise be activated or de-activated in a channel-specific way as a function of setting signal 5 to enable faults to be detected.

In various applications it is necessary for two or more analog signal channels 2 to be sampled and A/D converted synchronously. For this reason there is a means 18 provided which, as a function of the signal channel 2 to be converted at that moment, will if necessary generate a request for the A/D conversion of a further signal channel by another A/D converter. By means of the setting information stored in memory 13 it is possible to specify for any signal channel 2 whether a clocked A/D conversion by another A/D converter is required and, if so, by which other A/D converter which other signal channel is to be converted. This information is then passed on to means 18 by means of setting signal 5.

Also provided as shown in FIG.1 is a means 19 which, as a function of setting signal 5, generates control signals for other modules or sub-units in order to act thereon in the appropriate way. This is necessary whenever the result of converting a signal channel 2 should produce a given event, such as an interrupt for example. It is possible for example for the emergency-off function of a PWM unit or the like to be controlled in this way.

As well as the above mentioned functions which have been explained by reference to the means 14–19 which are shown in FIG.1, there are further steps which can be taken in a channel-specific way and which can similarly be performed by control unit 8.

Hence control unit 8 comprises for example an event sensor 11 which monitors the occurrence of a given event, such as a given interrupt for example. If the result of conversion for a previously converted signal channel 2 produces the event which is being monitored in a channel-specific way at the time, control unit 8 automatically requests the A/D conversion of another signal channel 2 or activates another request source 1. The events which are monitored for each signal channel 2 may in turn be stored in memory 13 in a channel-specific way in the form of appropriate setting information.

It is also conceivable for it be specified in a channel-specific way whether a sampled value from the signal channel 2 to be converted at the time is to be converted only once or a plurality of times in succession so that the mean of the individual conversion results can then be formed and stored in result register 7. If a repeated A/D conversion of its sampled values has been defined for a signal channel 2, control unit 8 ensures in the appropriate way that no other signal channel 2 is switched through to A/D converter 6 for the appropriate length of time or that no request signal 20 from another request source 1 is processed.

Control unit 8 may also have prioritising logic 10 which is provided to enable the request signals 20 received from the different request sources 1 to be dealt with under the control of priority. For this purpose prioritising logic 10 allocates a given priority to for example each request for the A/D converter and processes requests having a higher priority before requests having a lower one. Generally speaking, the order in which the conversions are to be performed can be decided by certain decision-making criteria which can be set in a channel-specific or request-source-specific way by control unit 9 as another of its functions. It is for example possible for information which specifies the order of the conversions of the individual signal channels 2 for a given request source 1 to be stored in memory 13 for each of the request sources 1.

The prioritising logic 10 in control unit 8 may in particular be so designed that if there are simultaneous requests for a signal channel 2 from a plurality of request sources 1 it can be decided in a channel-specific way whether the given signal channel 2 is to be converted only once or whether it is to be converted a number of times equal to the number of requests. This information too can be stored in memory 13 for each signal channel 2.

What is more, it can be specified for each signal channel 2 and/or for each request source 1 by means of appropriate setting information whether, when a request is received for the A/D conversion of a signal channel 2 which has been allocated a priority higher than that of the A/D conversion of another signal channel 2 which is being carried out at the time, the A/D conversion which is already underway will be continued to completion or whether it will be interrupted in favour of dealing with the request which has the higher priority and will not completed until later, namely after the A/D conversion with the higher priority has been completed.

The examples described above will make it clear that in general terms it is proposed as part of the present invention that certain operating parameters of the A/D converter arrangement be set in a channel-specific way in order thereby to adjust the A/D converter arrangement as a function of the signal channel to be converted at the time. The possible settings which have been detailed should of course be seen simply as examples and there are other operating parameters or functions of the A/D converter arrangement different from the possible settings which have been explained which can be set in a channel-specific way.

What is claimed is:

1. A method for the A/D conversion of analog signals, the method comprising the steps of subjecting analog signals from a plurality of signal channels to A/D conversion by means of an A/D converter arrangement, setting certain operating parameters of the A/D converter arrangement in a channel-specific way as a function of a signal channel which is to be converted, requesting A/D conversions of individual signal channels by a plurality of requesting means, assigning certain settings for the operating parameters of the A/D converter arrangement which are to be set, to individual requesting means, and for the A/D conversion of a signal channel which is requested by a given requesting means, setting the operating parameters of the A/D converter arrangement which are to be set, in agreement with the settings assigned to said requesting means making a request.

2. The method according to claim 1, wherein what are set in a channel-specific way as operating parameters of the A/D converter arrangement are parameters of an A/D converter in the A/D converter arrangement.

3. The method according to claim 2, wherein what are set in a channel-specific way as converter parameters of the A/D converter are at least one of a resolution, a sampling time, a conversion time, a calibration time, and a range of measurement of the A/D converter.

4. The method according to claim 1, wherein, as a function of the signal channel to be converted, an amplitude of the analog signal from this signal channel is subjected to limit-value monitoring, limit values which are monitored during the limit-value monitoring being set in a channel-specific way.

5. The method according to claim 1, wherein interrupts are generated in a channel-specific way as a function of the signal channel to be converted.

6. The method according to claim 1, wherein an external multiplexer is controlled in a channel-specific way as a function of the signal channel to be converted.

7. The method according to claim 1, wherein at least one of a short-circuit and a line-break monitor is activated in a channel-specific way as a function of the signal channel to be converted.

8. The method according to claim 1, wherein a synchronous A/D conversion at another A/D converter arrangement is requested in a channel-specific way as a function of the signal channel to be converted.

9. The method according to claim 1, wherein, as a function of the signal channel to be converted, the A/D conversion of the analog signal from this signal channel is carried out in a channel-specific way a plurality of times in succession and a mean of individual results of conversion is then formed.

10. The method according to claim 1, wherein, as a function of the signal channel to be converted, an occurrence of a given event after the A/D conversion of the analog signal from this signal channel is monitored and conversion of another signal channel is requested on detection of the occurrence of the given event.

11. The method according to claim 1, wherein, as a function of the signal channel to be converted, an occurrence of a given event after the A/D conversion of the analog signal from this signal channel is monitored and an external module unit is actuated in a channel-specific way on detection of the occurrence of the given event.

12. The method according to claim 1, wherein each request from a requesting means is allocated a certain priority, in which case, if there are a plurality of requests present simultaneously, individual requests are dealt with as a function of priority.

13. The method according to claim 12, further comprising, if there is a request for the A/D conversion of a signal channel while the A/D conversion of another signal channel, which was prompted by a request of lower priority than a current request, is still underway, specifying in a channel-specific way whether the A/D conversion which is underway is to be completed or whether it is to be at once interrupted in favor of starting the A/D conversion which has been requested by the current request of higher priority.

14. The method according to claim 1, further comprising, where there are a plurality of requests from different requesting means for the A/D conversion of a same signal channel, specifying as a function of this signal channel whether the analog signal from this signal channel is subjected to A/D conversion once or more than once.

15. The method according to claim 1, wherein each signal channel has assigned to it channel-specific settings for the operating parameters of the A/D converter arrangement which are to be set and, when the A/D conversion of a given signal channel is requested, the operating parameters of the A/D converter arrangement are set in agreement with the settings assigned to said signal channel.

16. The method according to claim 15, wherein the signal channels are combined into groups which each have assigned to them group-specific settings for the operating parameters of the A/D converter arrangement which are to be set and, when the A/D conversion of a signal channel in a given group is requested, the operating parameters of the A/D converter arrangement are set in agreement with the settings assigned to said group.

17. The method according to claim 15, wherein the operating parameters of the A/D converter arrangement remain set in agreement with the settings assigned to the signal channel to be converted until there is a request for an A/D conversion from a requesting means which has assigned to it settings of its own for the operating parameters of the A/D converter arrangement which are to be set, in which case the operating parameters of the A/D converter arrangement are set in agreement with the settings assigned to the requesting means making the request.

18. An A/D converter arrangement, comprising an A/D converter for A/D conversion of analog signals, selecting means to which the analog signals from a plurality of signal channels are fed, for selecting a signal channel to be converted and for feeding the analog signal from the signal channel selected to the A/D converter, control means for setting certain operating parameters of the A/D converter arrangement in a channel-specific way as a function of the signal channel to be converted, a plurality of requesting means for requesting A/D conversions of the individual signal channels being provided, wherein each requesting means has assigned to it certain settings for the operating parameters of the A/D converter arrangement which are to be set and these settings being stored in a memory means, and wherein the control means is so designed that, for the A/D conversion of a signal channel which is requested by a given requesting means, it sets the operating parameters of the A/D converter arrangement which are to be set in agreement with the settings assigned to said requesting means making a request which are stored in the memory means.

19. The A/D converter arrangement according to claim 18, wherein the control means is so designed that the operating parameters of the A/D converter arrangement which it sets in a channel-specific way are converter parameters of the A/D converter.

20. The A/D converter arrangement according to claim 19, wherein the control means is so designed that the converter parameters of the A/D converter which it sets in a channel-specific way are at least one of a resolution, a sampling time, a conversion time, a calibration time, and a range of measurement of the A/D converter.

21. The A/D converter arrangement according to claim 18, further comprising a limit-value monitor to monitor an amplitude of the analog signal from the signal channel to be converted in relation to certain limit values, wherein the control means is so designed that it sets the limit values monitored by the limit-value monitor in a channel-specific way as a function of the signal channel to be converted.

22. The A/D converter arrangement according to claim 18, further comprising an interrupt generating means to generate interrupts for the A/D converter arrangement, wherein the control means is so designed that it controls the interrupt generation by the interrupt generating means in a channel-specific way as a function of the signal channel to be converted.

23. The A/D converter arrangement according to claim 18, wherein the control means is so designed that it generates, in a channel-specific way, control signals to control an external multiplexer, as a function of the signal channel to be converted.

24. The A/D converter arrangement according to claim 18, further comprising means for at least one of short-circuit and line-break monitoring, wherein the control means is so designed that it activates the means for at least one of short-circuit and line-break monitoring in a channel-specific way as a function of the signal channel to be converted.

25. The A/D converter arrangement according to claim 18, wherein the control means is so designed that, in a channel-specific way, it generates a request signal for another A/D converter arrangement to carry out a synchronous A/D conversion, as a function of the signal channel to be converted.

26. The A/D converter arrangement according to claim 18, wherein the control means is so designed that, as a function of the signal channel to be converted, it causes the A/D conversion of the analog signal from this signal channel to be carried out a plurality of times and then forms a mean of individual conversion results.

27. The A/D converter arrangement according to claim 18, wherein the control means comprises an event monitoring means in order, as a function of the signal channel to be converted, to detect an occurrence of a certain event after the A/D conversion of the analog signal from this signal channel, the control means being so designed that on detection of the occurrence of the certain event it performs at least one of requesting conversion of another signal channel and generating a control signal for another module unit.

28. The A/D converter arrangement according to claim 18, wherein the control means comprises a prioritising means which allocates a certain priority to each request from a requesting means and if there are a plurality of simultaneous requests, deals with individual requests as a function of priority, the control means being so designed that if there is a request for the A/D conversion of a signal channel while the A/D conversion of another signal channel, which was prompted by a request of lower priority than a current request, is still underway, it decides in a channel-specific way whether the A/D conversion which is underway is to be completed or whether it is to be at once interrupted in favor of starting the A/D conversion which has been requested by the current request of higher priority.

29. The A/D converter arrangement according to claim 18, wherein the control means is so designed that where there are a plurality of requests from different requesting means for the A/D conversion of a same signal channel, it specifies as a function of this signal channel whether the analog signal from this signal channel is subjected to A/D conversion once or more than once.

30. The A/D converter arrangement according to claim 18, wherein each signal channel has assigned to it channel-specific settings for the operating parameters of the A/D converter arrangement which are to be set and these settings are stored in an appropriate memory means and the control means is so designed that if the A/D conversion of a given signal channel is requested the operating parameters of the A/D converter arrangement are set in agreement with the settings assigned to said signal channel which are stored in the memory means.

31. The A/D converter arrangement according to claim 30, wherein the control means is so designed that it sets the operating parameters of the A/D converter arrangement in agreement with the settings assigned to the signal channel to be converted until there is a request for an A/D conversion from a requesting means for which there are settings, stored in the memory means, for the operating parameters of the A/D converter arrangement which are to be set, in which case the control means sets the operating parameters of the A/D converter arrangement in agreement with the settings assigned to the requesting means making the request.

* * * * *